United States Patent [19]

Hollan

[11] 3,925,118

[45] Dec. 9, 1975

[54] METHOD OF DEPOSITING LAYERS WHICH MUTUALLY DIFFER IN COMPOSITION ONTO A SUBSTRATE

[75] Inventor: Laszlo Hollan, Sevres, France

[73] Assignee: U.S. Philips Corporation, New York, N.Y.

[22] Filed: Apr. 13, 1972

[21] Appl. No.: 243,592

[30] Foreign Application Priority Data

Apr. 15, 1971 France ............................ 71.13279

[52] U.S. Cl. ......... 148/175; 117/106 A; 117/107.1; 118/48; 118/49.1; 118/630; 148/174

[51] Int. Cl. ......................... H01l 7/36; C23c 11/00

[58] Field of Search ..................... 148/1.5, 174, 175; 117/106 A, 107.1; 118/48, 49.1, 630

[56] References Cited

UNITED STATES PATENTS

| | | | |
|---|---|---|---|
| 3,047,438 | 7/1962 | Marinace | 148/175 X |
| 3,173,814 | 3/1965 | Law | 148/175 |
| 3,184,348 | 5/1965 | Marinace | 148/174 |
| 3,314,393 | 4/1967 | Haneta | 118/48 |
| 3,341,376 | 9/1967 | Spenke et al. | 148/175 |
| 3,393,103 | 7/1968 | Hellbardt et al. | 148/175 |
| 3,441,454 | 4/1969 | Shaikh | 148/188 |
| 3,494,743 | 2/1970 | Baughman et al. | 118/49.1 X |
| 3,635,771 | 1/1972 | Shaw | 148/175 |
| 3,651,944 | 10/1971 | Sheng et al. | 148/189 |
| 3,672,948 | 6/1972 | Foehring et al. | 117/106 A X |

FOREIGN PATENTS OR APPLICATIONS

| | | | |
|---|---|---|---|
| 1,363,044 | 4/1964 | France | 148/174 |

OTHER PUBLICATIONS

Conrad et al., "Incorporation of Zinc . . . Diethyl Zinc" J. Electrochem. Soc., Vol. 113, No. 2, pp. 199–201, Feb. 1966.

*Primary Examiner*—L. Dewayne Rutledge
*Assistant Examiner*—W. G. Saba
*Attorney, Agent, or Firm*—Frank R. Trifari; Leon Nigohosian

[57] ABSTRACT

A method of and device for depositing successive layers of different compositions onto a substrate, for example, layers of differently doped semiconductor materials, in which vapours and/or gases comprising the components of the layer materials are introduced into a reaction vessel, which contains the substrate, at different locations, the compositions and/or amounts introduced being different at said different locations, the substrate being moved from one deposition position to another deposition position with respect to said locations. The layer material is deposited on the substrate while the latter is at various positions in the vessel.

6 Claims, 3 Drawing Figures

METHOD OF DEPOSITING LAYERS WHICH MUTUALLY DIFFER IN COMPOSITION ONTO A SUBSTRATE

The present invention relates to a method of providing successive layers, which mutually differ in composition, onto a substrate, in which the material for each of the said layers is deposited onto the substrate from the gaseous phase in a reaction vessel, for which purpose vapours comprising the constituents of such a material are conveyed to the substrate. The present invention also relates to a product comprising successive layers of mutually different composition, an electronic device comprising such a product, and a device for depositing materials from the gaseous phase on a substrate, particularly suitable for use in a method of the above-mentioned type.

For depositing layers, for example, of a semi-conductor material, from the gaseous phase on a substrate, it is known to convey the reacting vapours which comprise the constituent or the constituents of the material to be deposited, for example, in the form of one or more compounds thereof, to the substrate by means of a carrier gas, the substrate being heated to a given temperature which is suitable for the deposition. In this manner it is possible to form high-quality deposits. For example, further doping processes may then be carried out. One of the objects of the present invention is to provide a suitable method of depositing layers of different compositions, for example, differently doped, onto a substrate. In this manner a multi-layer structure can be obtained which may be suitable, for example, for manufacturing electronic devices, for example, Gunn effect diodes, diodes having variable capacity, avalanche diodes and other semi-conductor devices in which multilayer structures having different thicknesses and different dopings can be used, in particular in which the thicknesses of one or more of the said layers are very small, for example, in the order of a few hundred Angstroms. In such multi-layer structures, in particular in semi-conductor devices suitable for use at very high frequencies, it is often desirable to make the junctions between two differently doped regions comparatively abrupt. It is known to obtain multi-layer structures by varying dopings introduced into the reaction vessel or the quantities thereof. However, it may take some time until the gaseous phase in the reactor has varied and a constant new composition has been obtained.

It is one of the objects of the invention to mitigate the said drawbacks. According to the invention, a method of providing successive layers which mutually differ in composition are provided, onto a substrate, the material for each of the said layers being deposited onto the substrate from the gaseous phase in a reaction vessel, for which purpose vapours comprising the constituents of such a material are conveyed to the substrate. The vapours are intoduced into the reaction vessel at different locations and, during the deposition periods, the composition and/or the introduced quantities at different introduction locations are different, the substrate being successively maintained in different positions relative to said locations of introduction and the various layers being formed on the substrate during the stay of the substrate in said different positions. The layer may be deposited epitaxially on a substrate which consists, at least at its surface which is to be covered, of, for example, a monocrystalline material, possibly consisting of a material comprising the same basic constituent as the material which is deposited on the substrate. The term "vapours" is to be considered to have a wide meaning and includes in general materials in gaseous phase.

Due to accurately determined conditions as regards on the one hand the purity and on the other hand the partial pressures and the quantities of past-flowing gas per unit of time, the deposit may be provided in various positions of the substrate at suitable deposition temperatures. Quantities of gas and vapour which are introduced per unit of time at different locations in the reaction vessel are preferably maintained constant during the deposition on the substrate in the various positions. The processes are then carried out under conditions which can be determined previously and which are accurately maintained throughout the deposition process, the composition of the deposit being varied only by the displacement. At the areas of the various positions of the substrate, the same temperature is preferably used. As a result of this, the reaction conditions are only dependent upon the difference in composition of the gas in the various positions.

For providing successive layers consisting of the same basic constituent, but doped differently, an elongate reaction vessel is preferably used in which a gas flow is maintained in a longitudinal direction of the reaction vessel, locations for gas and/or vapour supply being present in said longitudinal direction in order of succession where a carrier gas, the component(s) of said basic constituent and one or more dopings are introduced in said order of succession. The substrate may be brought in different positions, where the gaseous phases have approximately the same concentration(s) of the component(s) of the basic constituent but, as regards added doping(s), differ mutually.

Gas mixtures having the same doping but in different concentrations are preferably introduced into the reaction vessel via supply apertures present at different locations. In this manner, for example, semiconductor layers of the desirable thickness and the same conductivity type can be obtained with different doping concentrations.

According to another preferred embodiment, dopings of different characters are introduced into the reaction vessel via two supply apertures present at different locations, for example, to form semi-conductor layers of opposite conductivity type, a donor via one supply aperture and an acceptor via another supply aperture.

It is to be noted that the introduction of vapours is to be understood to mean that this need not be carried out exclusively by means of supply ducts comprising orifices in the reaction vessel, but that a batch comprising or evolving an evaporable substance may also be present locally. However, the use of supply ducts having apertures is to be preferred because the quantities and concentrations of the locally introduced gas can be maintained constant during any desirable period of time more easily.

The displacement of the substrate can simply be carried out manually but may also be carried out mechanically according to a previously determined program. A device for the magnetic movement of the substrate in the reaction vessel may also be used so that no mechanically movable parts have to be passed through the wall of the reaction vessel. The danger of infiltration of atmospheric impurities is thus reduced, as a result of which layers of a higher purity can be obtained.

It will be obvious that, as a result of a substantially instantaneous position variation of the substrate the composition of the depositing material can be changed quickly and may result in new doping concentrations which remain substantially constant in further material deposited at the new position. In particular when successively chosen positions of the substrate have the same temperatures, the matching to the new circumstances after displacement from a first to a second position is of a very short duration so that in this manner very abrupt junctions can be realized.

It is possible with the described method according to the invention to obtain any number of layers of different compositions, in particular having mutually different doping concentrations, if desirable consisting of semiconductor material having p-n junctions.

Semiconductor layers from compounds of the type $A^{III}B^{V}$ can be obtained in particular with the method according to the invention. The constituents of said compounds can be conveyed to the substrate by means of hydrogen as a carrier gas and in the form of halogen compounds.

The invention furthermore comprises a product having successive layers of mutually different compositions which have been obtained by using the method according to the invention, and an electronic device, in particular a semi-conductor device, which comprises such a product in which the successive layers consist at least partly of electronically active material, in particular of semi-conductor material.

The present invention also comprises a device for depositing semi-conductor material from the gaseous phase onto a substrate, in particular for use in carrying out the method according to the invention, which device is characterized in that it comprises an elongate reaction vessel, supply ducts for separate flows of gas opening into the reaction vessel at different locations present one behind the other in the longitudinal direction, a gas outlet duct for exhausting gas from the reaction vessel, inside the reaction vessel a support for at least one substrate for depositing the materials thereon, means to move said support in the longitudinal direction with the reaction vessel and means to heat the substrate in various positions of the support in the vessel.

In order that the invention may be readily carried into effect, it will now be described in greater detail, by way of example, with reference to the accompanying drawing in which.

Figure 1:
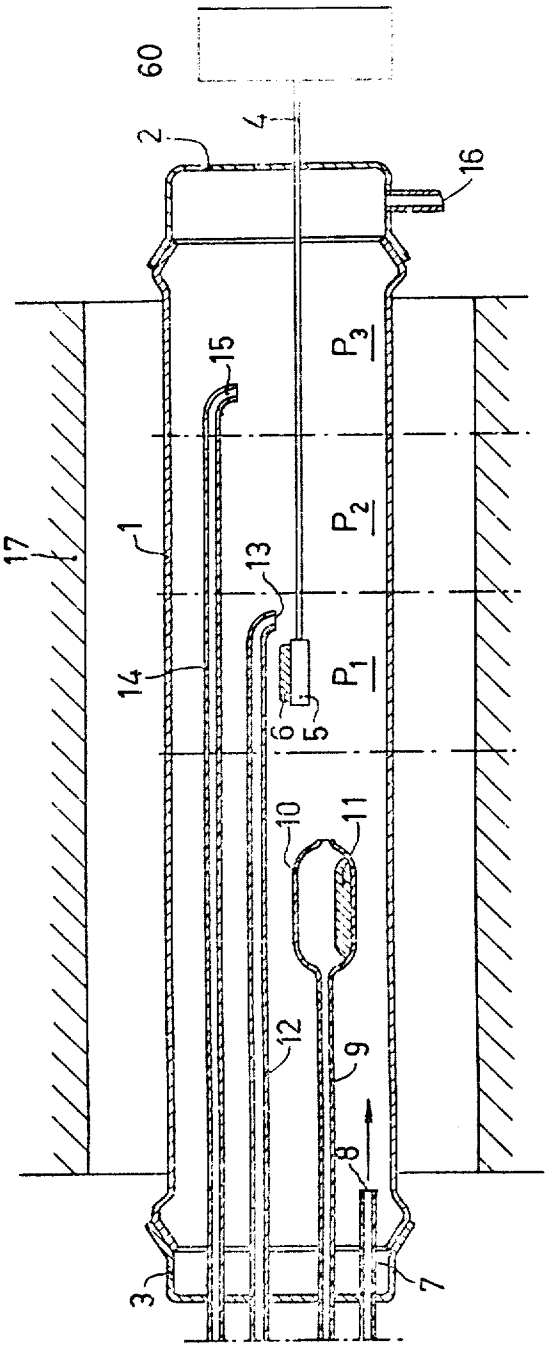
FIG. 1 is a diagrammatic cross-sectional view of a device according to the invention for carrying out the method according to the invention.

The dimensions and the proportions are not shown correctly in FIG. 1 for clarity reasons. For example, dimensions in the longitudinal direction of the device of FIG. 1 are more strongly reduced than the dimensions transverse to said longitudinal direction.

The device shown in FIG. 1 is an example of a device according to the invention suitable for use in an embodiment of the method according to the invention in which a semi-conductor compound of the type $A^{III}B^{V}$, for example gallium arsenide, is deposited. This device comprises a horizontal tubular reaction vessel 1, preferably of transparent quartz glass, which is closed at either end by ground stoppers 2 and 3. A rod 4 at one end of which a support 5 for a substrate to be covered with the semi-conductor material is secured, is passed through the ground stopper 2 at a first end of the reaction vessel. The other end of the rod 4 is connected to a device 60 for displacing the said substrate support 5 in the longitudinal direction of the reaction vessel. At least one plate-shaped substrate 6, for example, a monocrystalline semi-conductor body to be covered with semi-conductor material is placed on the substrate support 5. Via the ground stopper 3 of a second end of the tubular reaction vessel, a first gas supply tube 7 is passed which opens into the reaction vessel 1 at 8 and through which a carrier gas is supplied, for example, hydrogen. A second tube 9 is also passed through the ground stopper 3 and its end which is placed in the reaction vessel 1 is in the form of a container 10 in which a mass 11 of the least volatile component of the main constituent of the material to be deposited is provided, for example gallium in the case of depositing gallium arsenide. A reactive gas mixed with a carrier gas, for example arsenic trichloride ($AsCl_3$) mixed with hydrogen, is supplied via said tube 9. The reactive gas reacts with the mass 11 so as to convert the least volatile component into a volatile compound.

Another tube 12 is passed through the ground stopper 3 the aperture 13 of which is directed downwards. This tube 12 has such a length that the apertures 13 are present at a distance larger than half the length of the tubular reaction vessel 1 measured from the ground stopper 3, while the tubes 7 and 9 open into the first half of the length of the reaction vessel 1, measured from the second ground stopper 3. A further tube 14 passed through the stopper 3 has an aperture 15 which is also directed downwards. The tubes 12 and 14 have different lengths so that the aperture 15 is more remote from the stopper 3 than the aperture 13. These two tubes 12 and 14 have their apertures 13 and 15, respectively, comparatively remote from the container 10 in which the mass 11 of the least volatile component is placed, the distance being in the order of from 20 to 25 cm so as to avoid contamination of the said mass 11.

According to a possible embodiment, a carrier gas, for example hydrogen, and several doping agents are also supplied through the tubes 12 and 14. Said doping agents may be, for example, sulphur in vapour form and zinc in vapour form. The concentrations of doping agents in the carrier gas are preferably chosen in a wide range of a few ppm to a few hundreds of ppm. The stopper 2 is provided with a tube 16 for the exhaust of the gases.

According to an embodiment to be described in greater detail, a carrier gas, for example hydrogen, and one doping agent, for example sulphur in vapour form, is supplied through said tubes 12 and 14 in different quantities.

The tubular reaction vessel 1 is placed in a furnace 17 having different heating zones. The heating of said zones is adjusted so that, taken from the ground stopper 3, a desirable temperature for the reaction with the mass 11 prevails in the first half of the tubular vessel 1, for example, in the order of 835°C in the case in which the mass 11 consists of gallium and the gas supplied through the tube 9 consists of hydrogen and arsenic trichloride, and an approximately uniform temperature prevails in the second half of the reaction vessel 1 over a long range suitable for depositing the semiconductor, for example, in the order of 750°C ± 2°C, for depositing gallium arsenide. With an overall length of the tubular vessel of approximately 82 cm, the last-mentioned temperature is maintained over a length in the order of 40 cm.

Figure 2:
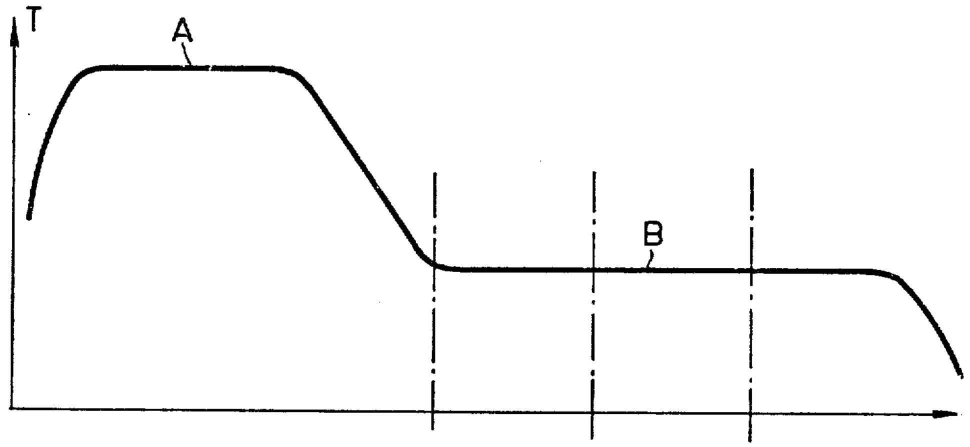
FIG. 2 shows in a graph a curve which shows diagrammatically the temperature distribution within a tubular reaction vessel as shown in FIG. 1 as a function of the length thereof in an embodiment of the method according to the invention.

In FIG. 2 the two zones are denoted by A and B, respectively. In the graph shown in FIG. 2 is plotted on the abscissa the temperature and on the ordinate the distance in the longitudinal direction of the reaction vessel from a point near the place 8 where the tube 7 opens.

Figure 3:
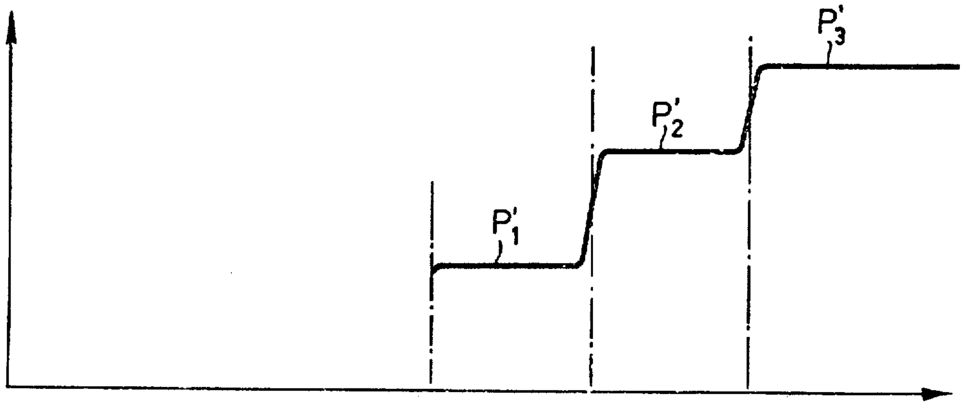
FIG. 3 shows in a graph an example of a curve which shows diagrammatically the charge carrier concentrations in doped semi-conductor material deposited on a substrate in a zone of uniform temperature in a device shown in FIG. 1, in accordance with the position of the substrate in said zone when using certain embodiments of the method according to the invention.

The substrate support is successively moved to different positions present near the apertures 13 and 15 of the tubes 12 and 14, respectively, via the rod 4 which is controlled by means of the device 60. In the case of epitaxial growing, the charge carrier concentrations of the deposited layers as a result of the doping concentrations obtained in these circumstances during epitaxial growing are shown diagrammatically in FIG. 3.

The substrate support with the substrate to be covered is placed at a given location, P1, relative to the aperture 13 of the tube 12 where it is maintained for a certain period of time. The substrate support is then moved to a second given location, P2, where it is maintained for a certain period of time, and so on, until the desirable number of layers is obtained. The duration of the stay in any location is chosen in accordance with the desirable thicknesses of the layers to be formed. These locations P1, P2 and P3 are shown in FIG. 1. In the device shown in FIG. 1, the doping concentration in the deposited material can be determined in accordance with the location of the substrate when supplying the same doping through the tubes 12 and 14. It has been found that zones P'1, P'2 and P'3 having lengths of 15, 15 and 10 cm, respectively, and comprising the locations P1, P2 and P3, respectively, can be demonstrated in the reaction vessel. In each of these zones the doping concentrations in the deposited semiconductor material do not vary substantially with the location of the substrate as is shown diagrammatically in FIG. 3 the logarithm the charge carrier concentrations as a result of the concentrations of one particular doping supplied through the tube 12 and through the tube 14 is plotted along the ordinate, and (in an analogous manner to FIG. 2) the distance in the longitudinal direction of the reaction vessel is plotted along the abscissa. The curve gives an indication of the increase of the doping concentration after moving the substrate to a zone P' present farther away from the stopper 3. In this manner, gallium arsenide layers have been deposited in a reproducible manner with different doping concentrations which lie, for example, in a range from an order of magnitude of $10^{15}$ atoms/ccm to an order of magnitude of $10^{18}$ atoms/ccm.

When, for example, the growth of the thickness of the layer being formed during deposition is in the order of from 10 to 20 μ per hour, times in the order of from 5 minutes to 1 hour are in general suitable for practical purposes, but shorter times, for example, in the order of from 10 to 20 seconds, as well as longer periods of time, for example, of a few hours, may also be used, if desirable.

The junctions produced between layers having different uniform doping levels may be considerably abrupt or extend to less than 1 μ. The above described method of depositing doped semiconductor layers is favourable in particular in the case of manufacturing multi-layer structures in which it is necessary to have considerably abrupt junctions over distances of a few hundreds of Angstrom, for example, in the order of approximately 300 Angstrom, very frequently.

Without departing from the scope of the present invention, it is possible to use in the device designed in FIG. 1 tubes other than the tubes 12 and 14, for example longer tubes, for the supply of dopings, for example opening between the aperture 15 and the stopper 2.

What is claimed is:

1. A method of providing on a substrate successive layers mutually differing in composition, comprising the steps of:

a. providing an elongated reaction vessel containing said substrate and comprising vapor introduction locations disposed in sequence along the longitudinal axis of said vessel;

b. introducing vapors into said vessel at different said vapor introduction locations, said vapors flowing generally in the longitudinal direction of said vessel and comprising the constituents for said layer materials and being conveyed in said vessel to said substrate, during at least said layer material deposition said vapor introduced at one of said introduction locations differing from vapors introduced at others of said introduction locations with respect to at least one of composition and constituent concentrations; and c. moving said substrate only along said axis so as to successively maintain said substrate at different positions in said vessel relative to said vapor introduction locations, said layer materials being deposited on said substrate while said substrate is disposed at various ones of said different positions.

2. A method as claimed in claim 1, wherein, during the deposition on the substrate in the different positions, the respective quantities of vapor introduced per unit of time at said different locations in the reaction vessel are maintained substantially constant.

3. A method as claimed in claim 1, wherein the same temperature is used at the respective vessel areas corresponding to various said positions of the substrate.

4. A method as recited in claim 1, wherein said successive layers individually consist essentially of the same basic constituent and at least one of, on the one hand, different respective doping impurities and, on the other hand, different concentrations of a certain doping impurity, and a carrier gas, at least one doping material, and a component of said basic constituent being introduced successively via said sequential introduction locations.

5. A method as claimed in claim 1, wherein said introduction locations comprise respective supply apertures and said vapors have the same doping impurity material but in different respective concentrations and are introduced into said reaction vessel via said supply apertures present at different points of said vessel.

6. A method as claimed in claim 1, wherein said introduction locations comprise respective supply apertures and different doping impurity materials are introduced into the reaction vessel via two of said supply apertures present at different locations.

* * * * *